(12) United States Patent
Ooyabu et al.

(10) Patent No.: US 7,482,800 B2
(45) Date of Patent: Jan. 27, 2009

(54) WIRED CIRCUIT BOARD AND CONNECTING STRUCTURE THEREOF

(75) Inventors: Yasunari Ooyabu, Osaka (JP); Yasuhito Ohwaki, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 11/295,520

(22) Filed: Dec. 7, 2005

(65) Prior Publication Data
US 2006/0118330 A1 Jun. 8, 2006

(30) Foreign Application Priority Data
Dec. 7, 2004 (JP) ............................. 2004-354531

(51) Int. Cl.
```
G01R 31/28    (2006.01)
H05K 1/00     (2006.01)
H05K 1/18     (2006.01)
H05K 7/00     (2006.01)
H05K 1/03     (2006.01)
H01R 12/00    (2006.01)
```
(52) U.S. Cl. ..................... 324/158.1; 361/748; 439/83; 174/255

(58) Field of Classification Search .............. 324/158.1; 174/261
See application file for complete search history.

(56) References Cited

U.S. PATENT DOCUMENTS

| | | | | |
|---|---|---|---|---|
| 4,543,715 A * | 10/1985 | Iadarola et al. | ................ | 29/852 |
| 5,621,193 A * | 4/1997 | Isaak | ........................... | 174/262 |
| 5,872,687 A | 2/1999 | Arya et al. | | |
| 6,351,351 B1 | 2/2002 | Takasugi | | |
| 6,399,889 B1 * | 6/2002 | Korkowski et al. | ........... | 174/255 |
| 6,639,800 B1 * | 10/2003 | Eyman et al. | ................ | 361/704 |
| 6,717,820 B1 * | 4/2004 | Loh | ........................... | 361/760 |
| 6,891,272 B1 * | 5/2005 | Fjelstad et al. | .............. | 257/774 |
| 7,081,645 B2 * | 7/2006 | Chen et al. | ..................... | 257/99 |
| 7,155,815 B2 * | 1/2007 | Gernhardt et al. | ............. | 29/825 |
| 2003/0026078 A1 * | 2/2003 | Komatsubara et al. | ....... | 361/746 |
| 2003/0098178 A1 * | 5/2003 | Shibuya et al. | .............. | 174/261 |

FOREIGN PATENT DOCUMENTS

| | | |
|---|---|---|
| JP | HEI 11-120715 | 4/1999 |
| JP | 2000-231709 | 8/2000 |

* cited by examiner

Primary Examiner—Ha Tran T Nguyen
Assistant Examiner—Roberto Velez
(74) Attorney, Agent, or Firm—Jean C. Edwards, Esq.; Akerman Senterfitt

(57) ABSTRACT

A wired circuit board that can allow precise connection between wired circuit boards with respect to a direction orthogonal to each other with a simple structure, while allowing reduction in size of the wired circuit boards, and a connecting structure of the wired circuit board comprising two wired circuit boards connected to each other with respect to a direction orthogonal to each other. Relay terminals 9 of the circuit suspension board 1 are arranged along one widthwise edge of the circuit suspension board 1, and terminal cutouts 10 cut in a generally semicircular arc shape from one edge thereof toward an widthwise inside thereof are formed in the relay terminals 9. In addition, insulating base layer cutouts 12 are formed in the first insulating base layer 3 to correspond to the terminal cutouts 10. The circuit suspension board 1 and a flexible wired circuit board for relay 21 are electrically connected to each other by fitting bumps 29 formed on suspension terminals 26 of the flexible wired circuit board for relay 21 in the terminal cutouts 10.

8 Claims, 8 Drawing Sheets

FIG. 4
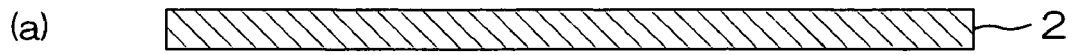
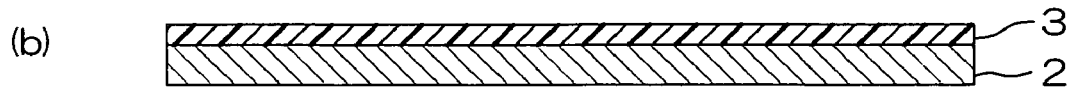
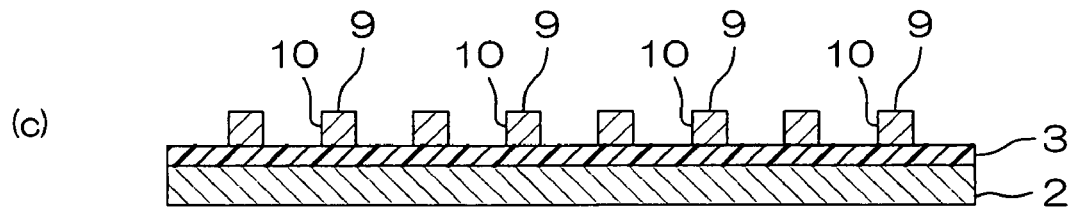
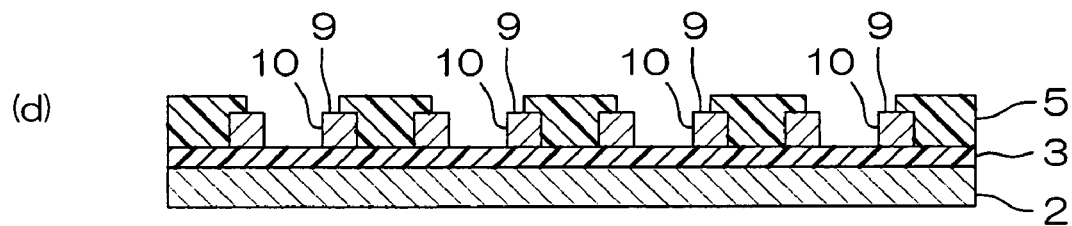
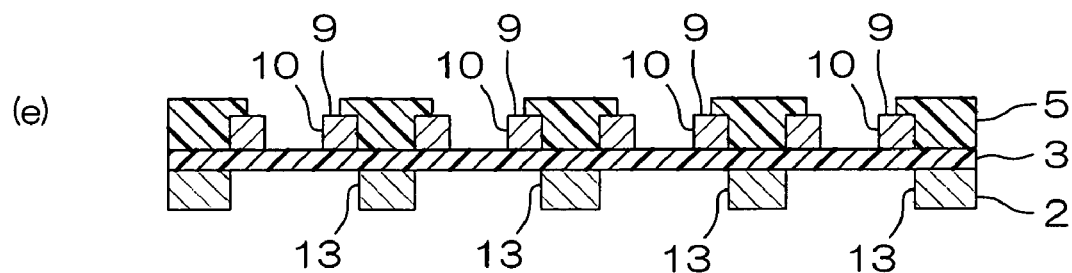
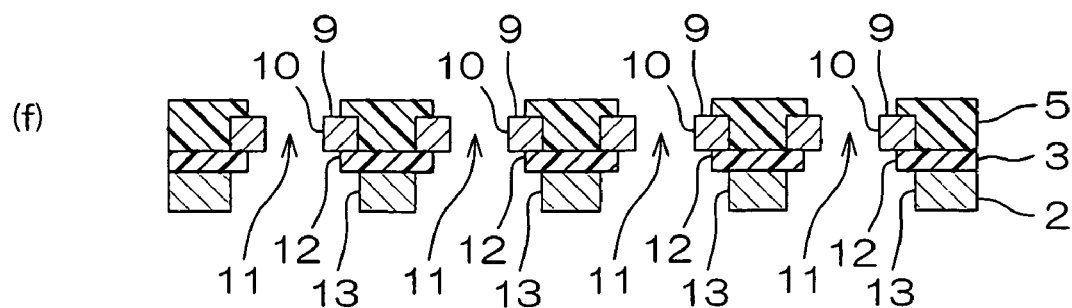

WIRED CIRCUIT BOARD AND CONNECTING STRUCTURE THEREOF

CROSS REFERENCE TO RELATED APPLICATION

This application claims priority from Japanese Patent Appln. No. 2004-354531, filed Dec. 7, 2004, the contents of which are herein incorporated by reference in their entirety.

BACKGROUND OF THE INVENTION

1. Field of the Invention

The present invention relates to a wired circuit board and to a connecting structure thereof More particularly, the present invention relates to a wired circuit board to be applied to a hard disc drive and the like and to the connecting structure thereof 2. Description of the Prior Art A hard disc drive is usually provided with a circuit suspension board for mounting a magnetic head thereon, and a flexible wired circuit board for relay connected to the circuit suspension board.

The circuit suspension board has a flexible wired circuit board integrally formed on a supporting board of metal, and a conductive pattern formed on the flexible wired circuit board and comprising lines of wire for transmitting electrical signals to the magnetic head, and magnetic-head terminals and relay terminals provided at opposite ends of the respective wires, all of which are integrally formed on the flexible wired circuit board. The magnetic heads are connected to the magnetic head terminals, and terminals of the flexible wired circuit board for relay are connected to the relay terminals.

For example, the relay terminals of the circuit suspension board and the terminals of the flexible wired circuit board for relay are interconnected in the following manner, as is known from JP Laid-open (unexamined) Patent Publication No. 2000-231709, for example. That is to say, after the flexible wired circuit board is bent at the relay terminals at a right angle from a widthwise edge of the supporting board of the circuit suspension board by the machining process, so that the relay terminals of the flexible wired circuit board are oriented to be orthogonal to the surface of the supporting board of metal, the terminals of the flexible wired circuit board for relay are connected to those orthogonally-oriented relay terminals from the lateral side.

However, a special precise machining process is required for bending the relay terminal with precision by the machining process. Meanwhile, along with increasing reduction in size of the hard disc drive in recent years, reduction in size of the circuit suspension board and the flexible wired circuit board for relay is demanded increasingly. Along with the increasing reduction in size of the circuit suspension board and the flexible wired circuit board for relay, it becomes harder to make the precise bending by the special machining process.

SUMMARY OF THE INVENTION

It is an object of the present invention to provide a wired circuit board that can allow precise connection between wired circuit boards with respect to a direction orthogonal to each other with a simple structure, while allowing reduction in size of the wired circuit boards. It is another object of the present invention to provide a connecting structure of the wired circuit boards connected with respect to the direction orthogonal to each other.

The present invention provides a first wired circuit board comprising a first insulating base layer, and a first conductive pattern formed on the first insulating base layer and including first terminals, wherein the first terminals have terminal cutouts formed to be arranged along an edge of the first wired circuit board by cutting out the first terminals from one edge thereof along a direction orthogonal to a thickness direction of the first terminals, and wherein the first insulating base layer has insulating base layer cutouts formed by cutting out its areas corresponding to cutout areas defined by the terminal cutouts.

In this first wired circuit board, the terminal cutouts and the insulating base layer cutouts are formed in the first terminals and the first insulating base layer, respectively, so that when the second terminals of the second wired circuit board to be connected to the first wired circuit board are fitted in the terminal cutouts and the insulating base layer cutouts, the first wired circuit board and the second wired circuit board can be connected to each other in a direction in which a thickness direction of the first terminals and a thickness direction of the second terminals are orthogonal to each other. This can allow precise connection of the first wired circuit board with the second wired circuit board with respect to the orthogonal direction with a simple structure, while allowing reduction in size of the same.

In the first wired circuit board of the present invention, it is preferable that a metallic supporting layer is formed on a back side of the first insulating base layer on the opposite side to a front side thereof on which the first conductive pattern is formed, and wherein the metallic supporting layer has metallic supporting layer cutouts formed by cutting out its areas corresponding to the cutout areas.

When the metallic supporting layer is formed in the first wired circuit board, the first wired circuit board can be increased in rigidity. Also, since the metallic supporting layer cutouts are formed in the metallic supporting layer so that when the first terminals and the second terminals are connected to each other in the orthogonal direction, no interference occurs, thus ensuring smooth connection of the first wired circuit board to the second wired circuit board in the orthogonal direction.

In the first wired circuit board of the present invention, it is preferable that a plurality of first terminals are provided at spaced intervals along an extending direction of an edge of the first insulating base layer, wherein the insulating base layer cutouts and the metallic supporting layer cutouts are formed to correspond to the first terminals, and wherein at least one projection projecting from an edge of the metallic supporting layer along a direction orthogonal to the thickness direction of the metallic supporting layer is/are formed in location(s) of the metallic supporting layer corresponding to between first terminals adjoining to each other.

The formation of the projection(s) can ensure that the first wired circuit board is precisely positioned relative to the second wired circuit board in the orthogonal direction by positioning the projection(s) with respect to the second wired circuit board.

Also, the present invention provides a second wired circuit board comprising a second insulating base layer, and a second conductive pattern formed on the second insulating base layer and including second terminals to be connected with the first terminals of the first wired circuit board, wherein a plurality of second terminals are provided at spaced intervals on the second insulating base layer, wherein at least one positioning hole, extending through the second insulating base layer in a thickness direction thereof, for positioning the first wired circuit board is/are formed between the second terminals adjoining to each other.

The formation of the positioning hole(s) in this second wired circuit board can ensure that the second wired circuit board is precisely positioned relative to the first wired circuit board by positioning the first wired circuit board via the positioning hole(s).

Further, the present invention provides a connecting structure of a wired circuit board comprising the first wired circuit board and the second wired circuit board, wherein the projections of the first wired circuit board are fitted in the positioning holes of the second wired circuit board.

In this connecting structure, since the projection(s) of the first wired circuit board is/are fitted in the positioning hole(s) of the second wired circuit board, the first wired circuit board and the second wired circuit board can be precisely positioned relative to each other with respect to the orthogonal direction. This can provide improved reliability in connection between the first terminals and the second terminals.

BRIEF DESCRIPTION OF THE DRAWINGS

In the drawings:

FIG. 4 is a process drawing showing a production method of the circuit suspension board shown in FIG. 1:

(a) shows the process of preparing a supporting board, (b) shows the process of forming an insulating base layer on the supporting board, (c) shows the process of forming a conductive pattern on the insulating base layer, (d) shows the process of forming an insulating cover layer on the insulating base layer, to cover the conductive pattern, (e) shows the process of forming supporting board cutouts in the supporting board, and (f) shows the process of forming insulating base layer cutouts in the insulating base layer.

(a) shows the process of preparing an insulating base layer, (b) shows the process of forming a conductive pattern on the insulating base layer, (c) shows the process of forming an insulating cover layer on the insulating base layer, to cover the conductive pattern, and (d) shows the process of forming bumps on the suspension terminals and external terminals.

DETAILED DESCRIPTION OF THE PREFERRED EMBODIMENTS

Figure 1:
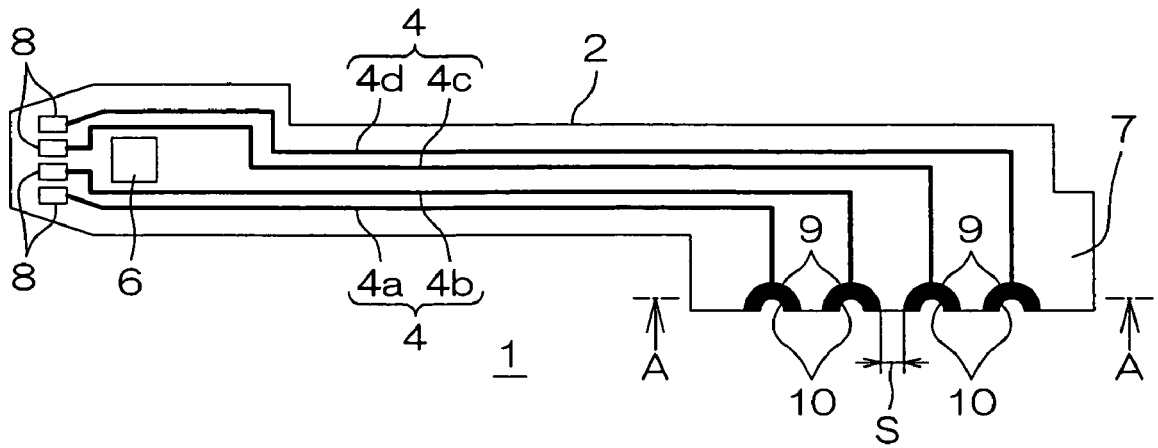
FIG. 1 is a plan view schematically showing a circuit suspension board (a suspension board with circuit) as an embodiment of a first wired circuit board of the present invention.
Figure 2:
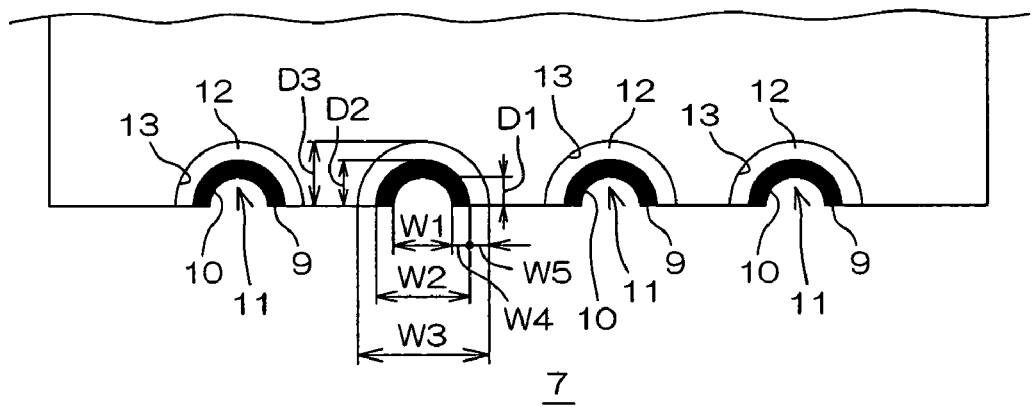
FIG. 2 is a bottom view of a principal part of the circuit suspension board shown in FIG. 1.
Figure 3:
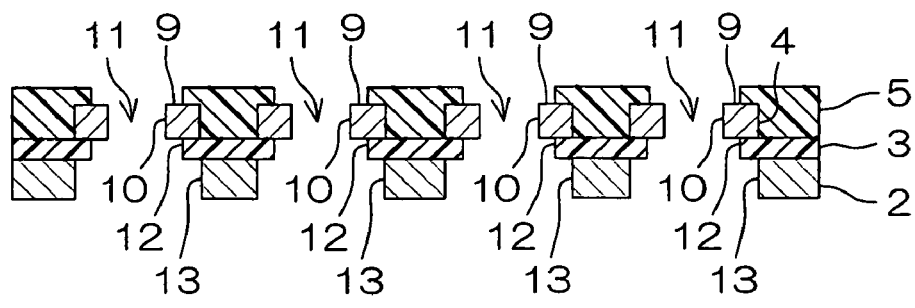
FIG. 3 is a cross-sectional view of the same taken along line A-A of FIG. 1.

FIG. 1 is a plan view schematically showing a circuit suspension board (a suspension board with circuit) as an embodiment of a first wired circuit board of the present invention. FIG. 2 is a bottom view of a principal part of the circuit suspension board shown in FIG. 1. FIG. 3 is a cross-sectional view of the same taken along line A-A of FIG. 1.

In FIG. 1, this circuit suspension board 1 is used to mount thereon a magnetic head of a hard disk drive (not shown) and support the magnetic head closely spaced from a magnetic disk, while holding it against an airflow generated when the magnetic head and the magnetic disk run relative to each other. The circuit suspension board 1 has a conductive pattern 4 integrally formed therewith for connection between the magnetic head and a flexible wired circuit board for relay 21.

This circuit suspension board 1 comprises an insulating base layer (a first insulating base layer) 3 (not shown in FIG. 1) formed on a supporting board (a metallic supporting layer) 2, a conductive pattern (first conductive pattern) 4 formed on the insulating base layer 3, and an insulating cover layer (first insulating cover layer) 5 (not shown in FIG. 1) formed on the insulating base layer 3 to cover the conductive pattern 4, as shown in FIG. 3.

The supporting board 2 is in the form of a thin sheet extending longitudinally and is provided, at a front end portion thereof, with a magnetic head mounting portion 6, such as gimbals and the like, for mounting the magnetic heads thereon, as shown in FIG. 1. It is also provided, at a rear end portion thereof, with a terminal arranging portion 7, formed to protrude to one widthwise direction of the supporting board 2 (orthogonal to the longitudinal direction thereof), for arranging relay terminals 9 mentioned later along the longitudinal direction of the supporting board 2.

The insulating base layer 3 is formed in the form of a predetermined pattern including an area where the conductive pattern 4 of the supporting board 2 is formed.

The conductive pattern 4 comprises a plurality of lines of wire 4a, 4b, 4c, and 4d, magnetic head terminals 8, and relay terminals 9 (first terminals), all of which are integrally formed. The lines of wire 4a, 4b, 4c, and 4d extend longitudinally of the circuit suspension board 1 and are spaced apart in parallel with each other with a predetermined interval along the widthwise direction.

The magnetic head terminals 8 are arranged at the front end portion of the circuit suspension board 1, to correspond to the lines of wire 4a, 4b, 4c, and 4d, respectively. These magnetic head terminals 8 are formed to be integral with and extend continuously from the front end portions of the lines of wire 4a, 4b, 4c, and 4d and are spaced apart with each other along a widthwise direction of the circuit suspension board 1. Magnetic heads (not shown) mounted on the magnetic head mounting portion 6 are connected to the magnetic head terminals 8.

Figure 7:
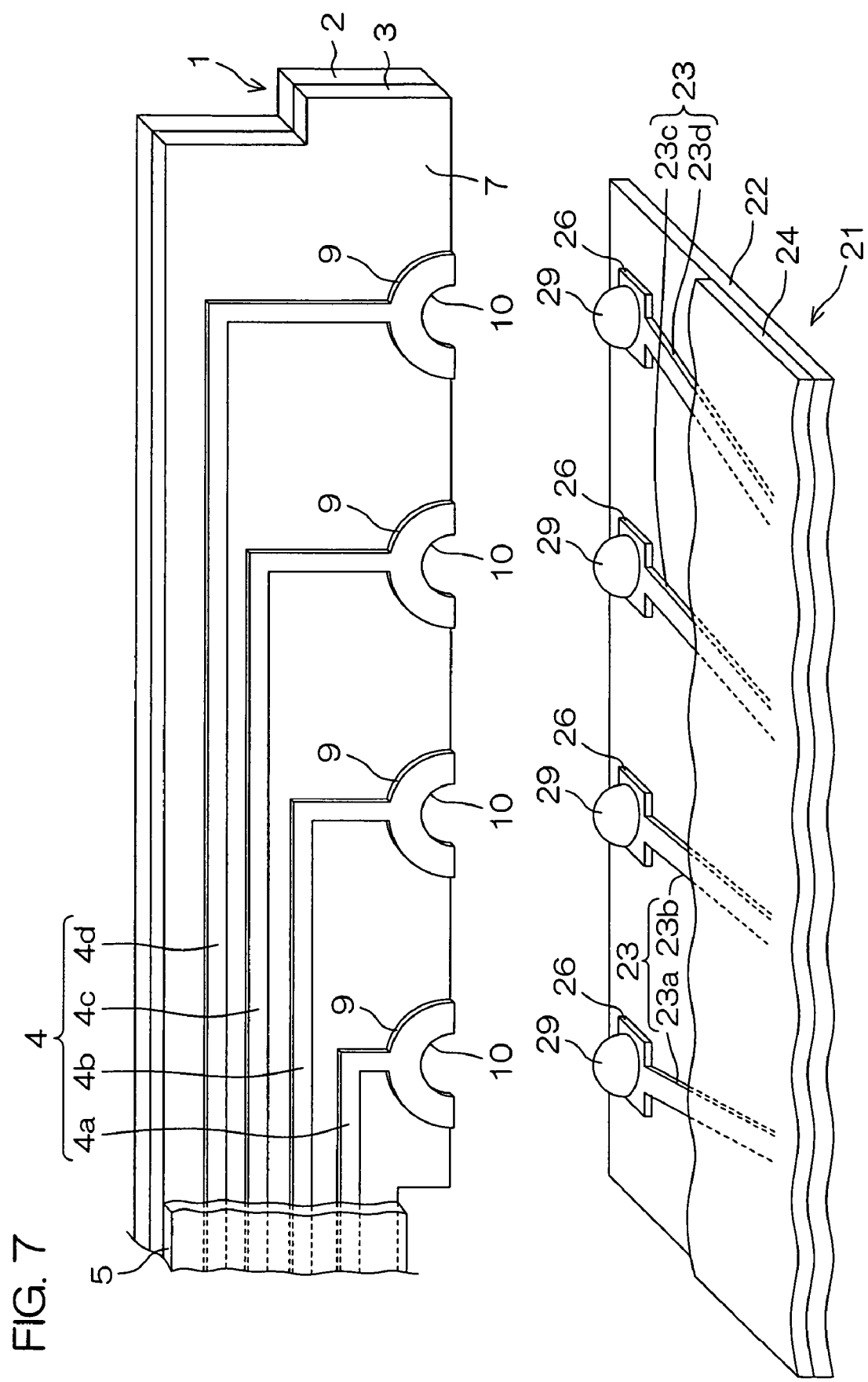
FIG. 7 is a perspective view for illustrating a principal part of the connection between the circuit suspension board shown in FIG. 1 and the flexible wired circuit board for relay shown in FIG. 5.

The relay terminals 9 are arranged in the terminal arranging portion 7 at the rear end portion of the circuit suspension board 1 and are located to correspond to the lines of wire 4a, 4b, 4c, and 4d, respectively. These relay terminals 9 are formed to be integral with and extend continuously from the rear end portions of the lines of wire 4a, 4b, 4c, and 4d and are spaced apart with each other along the longitudinal direction of the circuit suspension board 1. Suspension terminals 26 of the flexible wired circuit board for relay 21 are connected to the relay terminals 9 through bumps 29, as mentioned later (Cf. FIG. 7).

The relay terminals 9 are arranged in the terminal arranging portion 7 to be arrayed along one widthwise edge of the circuit suspension board 1. Each relay terminal 9 has a terminal cutout 10 formed by being cut in a generally semicircular arc shape, as viewed from top, extending from one edge thereof toward a widthwise inside of the circuit suspension board 1 (toward the other widthwise edge) along a widthwise direction thereof (a direction orthogonal to the thickness direction of the relay terminal 9).

The first insulating base layer 3 has insulating base layer cutouts 12 formed to correspond to the relay terminals 9 by cutting its areas corresponding to the cutout areas 11 defined by the terminal cutouts 10, as shown in FIG. 2.

Each insulating base layer cutout 12 is formed in a generally semicircular arc shape, as viewed from the bottom, to be larger than the terminal cutout 10 so as to expose the relay terminal 9 from the bottom by being cut in a generally semicircular arc shape extending from one widthwise edge of the insulating base layer 3 toward a widthwise inside of the insulating base layer 3 (toward the other widthwise edge) along a widthwise direction thereof (a direction orthogonal to the thickness direction of the insulating base layer 3).

The supporting board 2 has supporting board cutouts (metallic supporting board cutouts) 13 formed to correspond to the relay terminals 9 by cutting its areas corresponding to the cutout areas 11 defined by the terminal cutouts 10.

Each supporting board cutout 13 is formed in a generally semicircular arc shape, as viewed from the bottom, to be larger than the insulating base layer cutout 12 so as to expose the insulating base layer 3 from the bottom by being cut in a generally semicircular arc shape extending from one widthwise edge of the supporting board 2 toward a widthwise inside thereof (toward the other widthwise edge) along a widthwise direction thereof (a direction orthogonal to the thickness direction of the supporting board 2).

The insulating cover layer 5 is formed in a predetermined pattern on the insulating base layer 3, to cover the lines of wire 4a, 4b, 4c, and 4d but expose the magnetic head terminals 8 and the relay terminals 9, as shown in FIG. 3.

Next, a production method of this circuit suspension board 1 will be described with reference to FIG. 4. In FIG. 4, the circuit suspension board 1 is shown in section taken along line A-A of FIG. 1.

In this method, the supporting board 2 is prepared, first, as shown in FIG. 4(a). A metal foil or a thin metal sheet is used as the supporting board 2. No particular limitation is imposed on the metals used for the supporting board 2. For example, stainless steel, 42-alloy, aluminum, copper-beryllium, phosphor bronze, and so on are used for the supporting board 2. Preferably, stainless foil is used in terms of rigidity, corrosion resistance and workability. The supporting board 2 has a thickness of e.g. 10-100 µm, or preferably 18-30 µm and a width of e.g. 50-500 mm, or preferably 125-300 mm.

Then, the insulating base layer 3 is formed on the supporting board 2 to have a predetermined pattern, as shown in FIG. 4(b).

No particular limitation is imposed on the insulating materials used for forming the insulating base layer 3. For example, synthetic resins, such as polyimide resin, polyamide imide resin, acrylic resin, polyether nitrile resin, polyether sulfonic resin, polyethylene terephthalate resin, polyethylene naphthalate resin and polyvinyl chloride resin. Of these synthetic resins, polyimide resin is preferably used in terms of heat resistance and chemical resistance. In addition, photosensitive resin is preferably used in terms of easiness in fine processing of the pattern. Further preferably, photosensitive polyimide resin (photosensitive polyamic acid resin) is used.

The insulating base layer 3 is formed by the following processes, for example. After a varnish of photosensitive resin (photosensitive polyamic acid resin) is coated over the entire surface of the supporting board 2, the varnish is exposed to light through a photo mask and then developed, to form the coating in the form of a predetermined pattern including an area where the conductive pattern 4 is formed, or an area where the magnetic head terminals 8, the lines of wire 4a, 4b, 4c, 4d, and the relay terminals 9 (i.e., terminal arranging portion 7) are formed. Then, after the varnish is dried, it is cured by heating. The insulating base layer 3 of the predetermined pattern is formed in the manner mentioned above.

The insulating base layer 3 has a thickness of e.g. 5-20 µm, or preferably 7-115 µm.

Then, the conductive pattern 4 is formed on the insulating base layer 3, as shown in FIG. 4(c). No particular limitation is imposed on the conductive materials for forming the conductive pattern 4. For example, copper, nickel, gold, solder, or alloys thereof may be used for the conductive pattern 4. Copper is preferably used in terms of electrical conductivity, cost efficiency, and easiness in workability.

No particular limitation is imposed on the formation of the conductive pattern 4. For example, the conductive pattern 4 is formed by a known patterning process, such as a subtractive process and an additive process.

In the additive process, a thin metal film (a seed film) is formed on the entire surface of the insulating base layer 3, first. The thin metal film is formed by a thin film formation process, such as a sputtering process, using chromium, nickel, copper, and alloys thereof. Then, a plating resist of a reverse pattern to the conductive pattern 4 is formed on a surface of the thin metal film. The plating resist is formed by a known process using a photosensitive dry film resist, and the like. Thereafter, the conductive pattern 4 is formed on a surface of the insulating base layer 3 exposed from the plating resist. The conductive pattern 4 is formed by the electrolytic plating, or preferably by the electrolytic copper plating, for example. Thereafter, the plating resist is removed by etching or stripping and then the thin metal film exposed from the conductive pattern 4 is removed by etching.

In the subtractive process, a metal foil, such as for example a copper foil, is laminated on the entire surface of the insulating base layer 3 via, if necessary, an adhesive layer, first. Then, etching resist having the same pattern as the conductive pattern is formed on a surface of the metal foil. The etching resist is formed by a known process using photosensitive dry film resist and the like. Thereafter, after the metal foil exposed from the etching resist is removed by etching, the etching resist is removed by etching or stripping.

As a result of these processes, the lines of wire 4a, 4b, 4c, 4d, the magnetic head terminals 8, and the relay terminals 9 are integrally formed to form the conductive pattern 4, as shown in FIG. 1.

The conductive pattern 4 has a thickness of e.g. 3-30 µm or preferably 8-18 µm, and the lines of wire 4a, 4b, 4c, and 4d have each a width of e.g. 5-500 µm or preferably 10-200 µm. The interval between the adjacent lines of wire 4a, 4b, 4c, and 4d is for example in the range of 5-500 µm, or preferably 10-200 µm.

The relay terminals 9 have a thickness of e.g. 0.1-20 μm, and the terminal cutouts 10 have an opening width W1 (Cf. FIG. 2) of e.g. 40-1,000 μm and have a cutout depth D1 (Cf. FIG. 2) of e.g. 20-500 μm. The space S between the adjacent relay terminals 9 (Cf. FIG. 1) is for example in the range of 0.15-0.45 μm.

Then, the insulating cover layer 5 is formed on the insulating base layer 3, to cover the conductive pattern 4, as shown in FIG. 4(d).

No particular limitation is imposed on the insulating material used for forming the insulating cover layer 5. For example, the same insulating material as the one for forming the insulating base layer 1 is used for forming the insulating cover layer 5. Preferably, photosensitive resin, or further preferably photosensitive polyimide resin (photosensitive polyamic acid resin) is used.

The insulating cover layer 5 is formed by the following processes, for example. After a varnish of photosensitive resin (photosensitive polyamic acid resin) is coated over the entire surface of the insulating base layer 3, to cover the conductive pattern 4, the varnish is exposed to light through the photo mask and then developed, to form the coating in a predetermined pattern, such that the lines of wire 4a, 4b, 4c, 4d are covered but their portions corresponding to the magnetic head terminals 8 and the relay terminals 9 at opposite ends of the lines of wire 4a, 4b, 4c, 4d are uncovered. Then, after the varnish is dried, it is cured by heating. As a result of these processes, the insulating cover layer 5 of the predetermined pattern where the lines of wire 4a, 4b, 4c, 4d are covered but the magnetic head terminals 8 and the relay terminals 9 are uncovered or exposed is formed.

The insulating cover layer 5 has a thickness of e.g. 5-20 μm, or preferably 7-15 μm.

Then, supporting board cutouts 13 are formed in the supporting board 2, as shown in FIG. 4(e). The supporting board cutouts 13 are formed by a known method such as for example the chemical etching. In the formation of the supporting board cutouts 13, the cutting of the magnetic head mounting portion 6 and the trimming of the circuit suspension board 1 can be performed simultaneously. The supporting board cutouts 13 have an opening width W3 (Cf FIG. 2) of e.g. 250-1,000 μm and have a cutout depth D3 (Cf. FIG. 2) of e.g. 150-800 μm.

Thereafter, the insulating base layer cutouts 12 are formed in the insulating base layer 3 exposed from the supporting board cutouts 13 of the supporting board 2, as shown in FIG. 4(f). The insulating base layer cutouts 12 are formed by a known method such as for example the chemical etching. The insulating base layer cutouts 12 have an opening width W2 (Cf. FIG. 2) of e.g. 250-900 μm and have a cutout depth D2 (Cf. FIG. 2) of e.g. 95-630 μm.

As a result, the terminal cutouts 10 in the relay terminals 9 are exposed in the form of a generally circular arc having a strip width W4 of 50-200 μm from the bottom of the circuit suspension board 1, and the insulating base layer cutouts 12 are exposed in the form of a generally circular arc having a strip width W5 of 100-500 μm to surround the exposed terminal cutouts 10, as shown in FIG. 2.

This arrangement of the insulating base layer cutouts 12 being exposed between the exposed terminal cutouts 10 and the supporting board 2 can prevent the relay terminals 9 from being shorted through the supporting board 2.

The magnetic head terminals 8 and the relay terminals 9 are plated by electroless plating, to form a plating layer of solder or gold on their surfaces. The plating layer has a thickness of e.g. 0.1-20 μm.

In the circuit suspension board 1 thus obtained, the terminal cutouts 10, the insulating base layer cutouts 12, and the supporting board cutouts 13 are formed in the relay terminals 9, the insulating base layer 3, and the supporting board 2 respectively, so that when bumps 29 of suspension terminals 26 of a flexible wired circuit board for relay 21 to be connected to this circuit suspension board 1, mentioned later, are fitted in the terminal cutouts 10, the circuit suspension board 1 and the flexible wired circuit board for relay 21 can be connected to each other with respect to the direction in which they are orthogonal to each other. This can allow precise connection of the circuit suspension board 1 with the flexible wired circuit board for relay 21 with respect to the orthogonal direction with a simple structure, while allowing reduction in size of the same.

The circuit suspension board 1 is provided with the supporting board 2. This arrangement can provide increased rigidity of the circuit suspension board 1. Also, since the supporting board cutouts 13 are formed in the supporting board 2 so that when the circuit suspension board 1 and the flexible wired circuit board for relay 21 are connected to each other in the orthogonal direction, no interference occurs, thus allowing smooth connection of the circuit suspension board 1 to the flexible wired circuit board for relay 21 in the orthogonal direction.

Although the embodiment wherein the terminal cutouts 10 of the relay terminals 9 and the corresponding insulating base layer cutouts 12 and supporting board cutouts 13 are cut in a generally semicircular arc shape, that is, are formed in a generally semicircle-shaped cutouts has been described above, no particular limitation is imposed on the form of the cutouts. As long as the cutouts are recessed in e.g. a generally oval or ellipse shape, a generally V shape, a generally U shape, and the like, the shapes of the cutouts may be properly selected for intended purposes and applications. The cutout of a generally semicircle shape or a generally oval or ellipse shape are of preferable in terms of easiness for the bumps 29 formed in the suspension terminals 26 of the flexible wired circuit board for relay 21 mentioned next to engage in the cutouts.

The insulating base layer cutouts 12 may be formed, for example, in the process of forming the insulating base layer 3, rather than in the subsequent process using the etching mentioned above.

Figure 5:
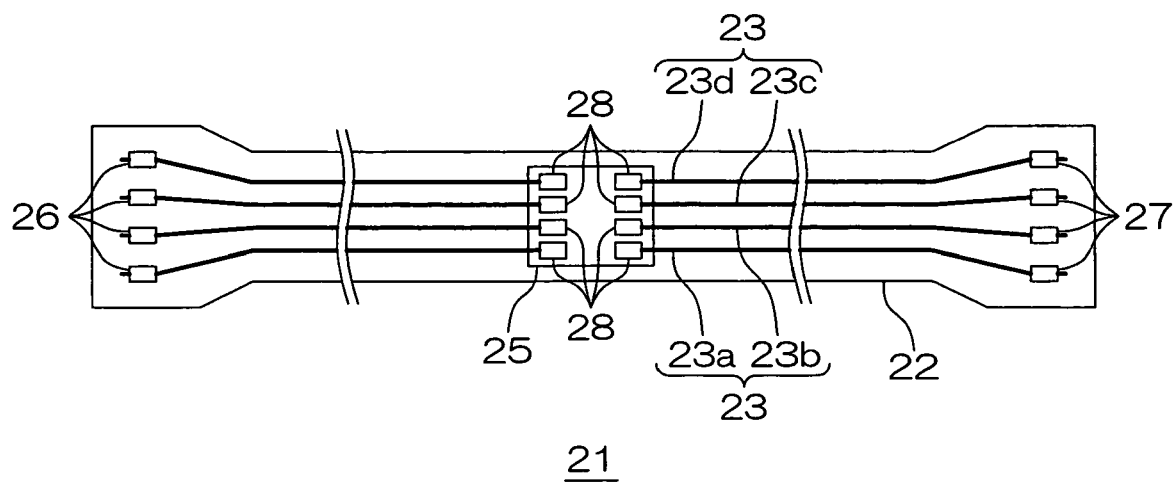
FIG. 5 is a plan view schematically showing a flexible wired circuit board for relay as an embodiment of a second wired circuit board of the present invention.

FIG. 5 is a plan view schematically showing the flexible wired circuit board for relay as an embodiment of the second wired circuit board of the present invention.

In FIG. 5, this flexible wired circuit board for relay 21 mounts thereon a preamplifier IC, not shown, to amplify read/write signals from the magnetic head at the preamplifier IC and then transmit the amplified signals to various control devices. It has a conductive pattern 23 integrally formed therewith to be connected with the circuit suspension board 1.

Figure 6:
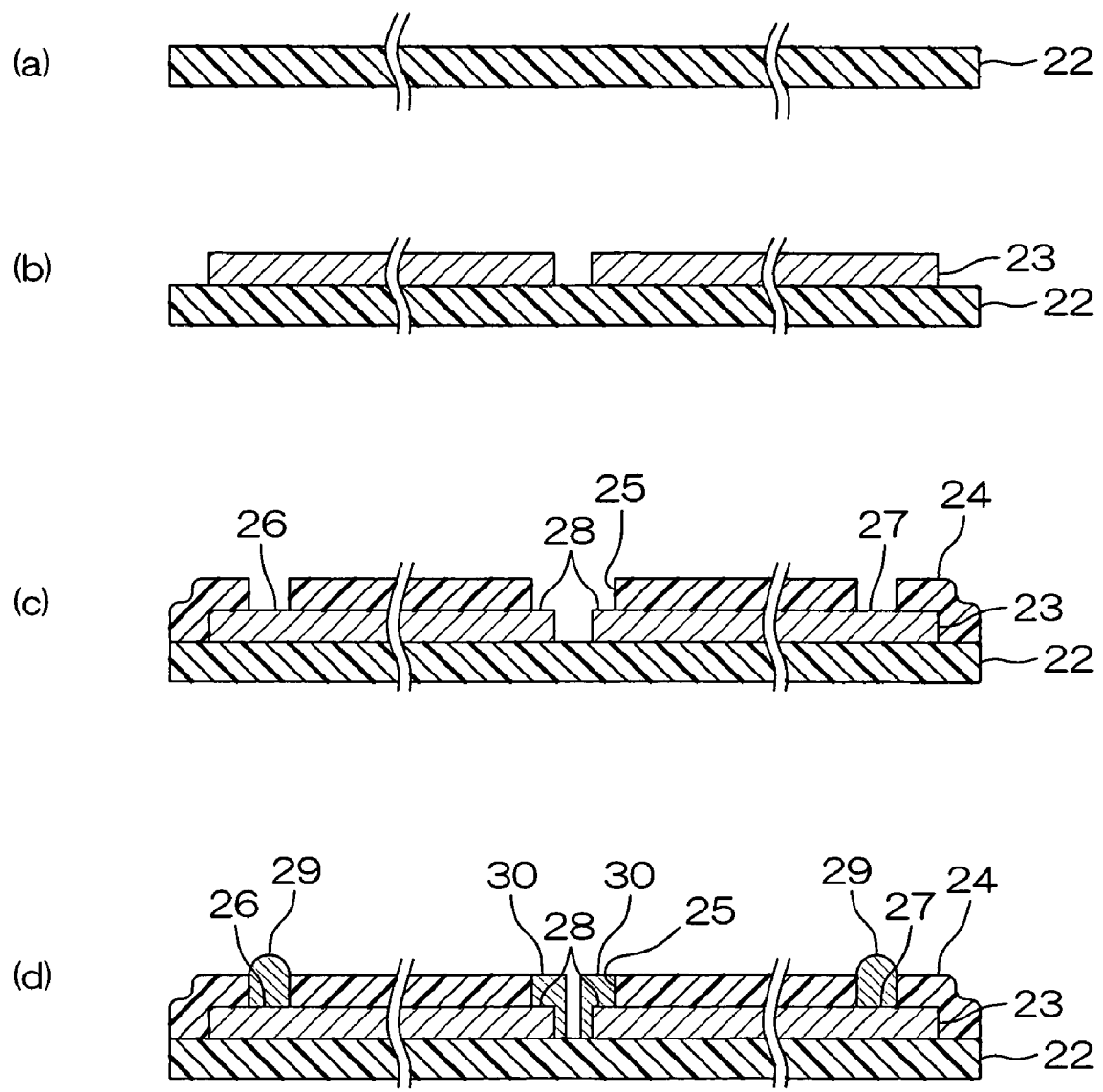
FIG. 6 is a process drawing showing a production method of the flexible wired circuit board for relay shown in FIG. 5.

This flexible wired circuit board for relay 21 comprises an insulating base layer (a second insulating base layer) 22, and a conductive pattern (a second conductive pattern) 23 formed on the insulating base layer 22. An insulating cover layer (a second insulating cover layer) 24 (Cf. FIG. 6) is formed on the insulating base layer 22 to cover the conductive pattern 23, though not shown in FIG. 5.

The insulating base layer 22 is formed in the form of a strip of film having flexibility and extending longitudinally.

The conductive pattern 23 comprises a plurality of lines of wire 23a, 23b, 23c, and 23d, suspension terminals (second terminals) 26, and external terminals 27, and preamplifier IC terminals) 28, all of which are integrally formed. The lines of wire 23a, 23b, 23c, and 23d extend longitudinally of the insulating base layer 22 and are spaced apart in parallel with each other with a predetermined interval along the widthwise direction.

The suspension terminals 26 are arranged at the front end portion of the flexible wired circuit board for relay 21, to correspond to the lines of wire 23a, 23b, 23c, and 23d, respectively. These suspension terminals 26 are formed to be integral with and extend continuously from the front end portions of the lines of wire 23a, 23b, 23c, and 23d and are spaced apart with each other along a widthwise direction of the flexible wired circuit board for relay 21. The suspension terminals 26 are connected to the relay terminals 9 of the circuit suspension board 1 via the bumps 29, as mentioned later (Cf. FIG. 7).

The external terminals 27 are arranged at a rear end portion of the flexible wired circuit board for relay 21 and are located to correspond to the lines of wire 23a, 23b, 23c, and 23d, respectively. These external terminals 27 are formed to be integral with and extend continuously from the rear end portions of the lines of wire 23a, 23b, 23c, and 23d and are spaced apart with each other along the widthwise direction of the flexible wired circuit board for relay 21. The external terminals 27 are connected to various control devices.

The preamplifier IC terminals 28 are arranged in a preamplifier IC mounting portion 25 located partway along the longitudinal direction of the flexible wired circuit board for relay 21 to correspond to the lines of wire 23a, 23b, 23c, 23d. The preamplifier IC terminals 28 are paired for each line of wire 23a, 23b, 23c, 23d divided into two parts at a lengthwise intermediate portion thereof and are located at spaced interval to confront each other, to be connected with the preamplifier IC.

The insulating cover layer 5 is formed in a predetermined pattern on the insulating base layer 3, to cover the lines of wire 23a, 23b, 23c, and 23d but expose the suspension terminals 26, the external terminals 27, and the preamplifier IC terminals 28, though not shown in FIG. 5.

Next, a production method of this flexible wired circuit board for relay 21 will be described with reference to FIG. 6. In FIG. 6, the flexible wired circuit board for relay 21 is shown in section taken along the longitudinal direction of the flexible wired circuit board for relay 21 of FIG. 6.

In this method, the insulating base layer 22 is prepared, first, as shown in FIG. 6(a). No particular limitation is imposed on the insulating materials used for forming the insulating base layer 22. For example, the same synthetic resin as the synthetic resin used for the insulating base layer 3 of the circuit suspension board 1 is used for the insulating base layer 22. Preferably, polyimide resin is used for the insulating base layer 22.

The insulating base layer 22 has a thickness of e.g. 5-50 µm, or preferably 10-25 µm.

Then, the conductive pattern 23 is formed on the insulating base layer 22, as shown in FIG. 6(b). No particular limitation is imposed on the conductive materials for forming the conductive pattern 23. For example, the same metal as the metal used for the conductive pattern 4 of the circuit suspension board 1 is used for forming the conductive pattern 23.

No particular limitation is imposed on the formation of the conductive pattern 23. For example, the conductive pattern 23 is formed by a known patterning process, such as the subtractive process and the additive process.

For example in the subtractive process, a metal foil is laminated on the entire surface of the insulating base layer 22 via, if necessary, an adhesive layer (not shown), or a commercially available bilayer base material having the metal foil laminated on the insulating base layer 22 is prepared, first.

Then, an etching resist is formed on a surface of the metal foil to have a corresponding pattern to the conductive pattern 23. Thereafter, after the metal foil exposed from the etching resist is etched, the etching resist is removed by stripping.

The adhesive layer is formed of epoxy resin, polyimide resin, and the like, having a thickness of e.g. 5-50 µm.

As a result of these processes, the lines of wire 23a, 23b, 23c, 23d, the suspension terminals 26, the external terminals 27, and the preamplifier IC terminals 28 are integrally formed to form the conductive pattern 23, as shown in FIG. 5.

The conductive pattern 23 has a thickness of e.g. 5-50 µm or preferably 8-18 µm, and the lines of wire 23a, 23b, 23c, and 23d have each a width of e.g. 5-500 µm or preferably 10-200 µm. The interval between the adjacent lines of wire 23a, 23b, 23c, and 23d is for example in the range of 5-500 µm, or preferably 10-200 µm.

The suspension terminals 26 are formed at e.g. 40-1,000 µm☐.

Then, the insulating cover layer 24 is formed on the insulating base layer 22, to cover the conductive pattern 23, as shown in FIG. 6(c).

No particular limitation is imposed on the insulating material used for forming the insulating cover layer 24. For example, the same synthetic resin as the one for forming the insulating base layer 22 is used for forming the insulating cover layer 24. Preferably, polyimide resin is used for the insulating cover layer 24.

The insulating cover layer 24 is formed by the following processes, for example. A film having openings formed at locations corresponding to the suspension terminals 26, the external terminals 27, and the preamplifier IC terminals 28 is prepared, first, and, then, the film is adhesively bonded to the insulating base layer 3 through an adhesive layer, whereby the insulating cover layer 24 is formed in the form of a predetermined pattern, such that the lines of wire 23a, 23b, 23c, 23d are covered and the suspension terminals 26, the external terminals 27, and the preamplifier IC terminals 28 are exposed.

The insulating cover layer 24 has a thickness of e.g. 4-50 µm, or preferably 5-25 µm.

Then, the bumps 29 formed of molten metal are formed at the suspension terminals 26 and the external terminals 27, as shown in FIG. 6(d). Though no particular limitation is imposed on the molten metals, for example Sn alloys (solder alloys), such as Sn—Ag, Sn—Bi, Sn—Cu, Sn—Pb, and Sn—Ag—Cu, may be used for the bumps 29 in terms of production efficiency and cost efficiency. The bumps 29 are formed in a generally hemispherical shape (Cf. FIG. 7). Preferably, this hemispherical-shaped bumps 29 is 20-500 µm in height and 40-1,000 µm φ in size of the bottom.

A plating layer 30, such as a nickel plating layer of 1-5 µm thick and/or a gold plating layer of 0.1-3 µm thick, are formed single or by lamination on surfaces of the preamplifier IC terminals 28 by electroless plating, for example.

Further, a stiffener sheet of e.g. a metal foil and the like may be adhesively bonded to the back side of the insulating base layer 22 (the opposite side to the front side in which the conductive pattern 23 on the insulating base layer 22 are formed) to stiffen portions of the insulating base layer 22 corresponding to the suspension terminals 26, the external terminals 27, and the preamplifier IC terminals 28 through the adhesive layer, if necessary, though not shown.

Figure 8:
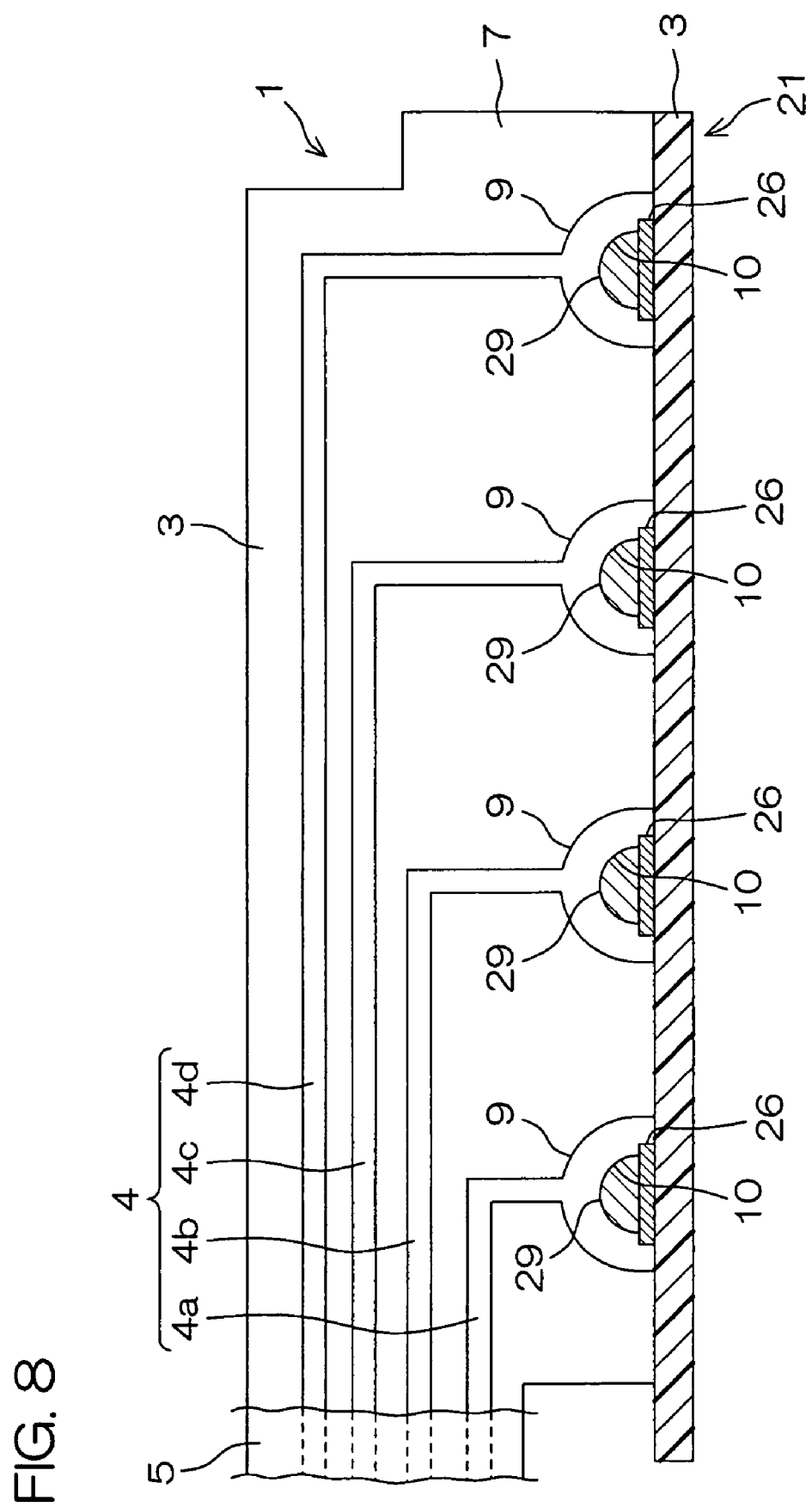
FIG. 8 is a cross-sectional view for illustrating a principal part of the connection between the circuit suspension board shown in FIG. 1 and the flexible wired circuit board for relay shown in FIG. 5.

Then, the flexible wired circuit board for relay 21 thus obtained is connected to the circuit suspension board 1 in the orthogonal direction, as shown in FIGS. 7 and 8. It is to be noted that before the flexible wired circuit board for relay 21 and the circuit suspension board 1 are connected to each other, the magnetic heads, not shown, are mounted on the magnetic head terminals 8 of the circuit suspension board 1 and the preamplifier ICs, not shown, are mounted on the preamplifier IC terminals 28 of the flexible wired circuit board for relay 21.

The connection therebetween is performed in the following manner. First, the relay terminals 9 of the circuit suspension board 1 and the suspension terminals 26 of the flexible wired circuit board for relay 21 are located to confront each other by orienting the circuit suspension board 1 and the flexible wired circuit board for relay 21 to be orthogonal to each other, as shown in FIG. 7. Then, the bumps 29 of the suspension terminals 26 are received in the terminal cutouts 10 in the relay terminals 9 toward widthwise inward of the circuit suspension board 1, whereby the bumps 29 of the suspension terminals 26 are fitted in the terminal cutouts 10 in the relay terminals 9, as shown in FIG. 8. As a result of this, the relay terminals 9 and the suspension terminals 26 are electrically connected to each other. In this connected state, the circuit suspension board 1 and the flexible wired circuit board for relay 21 are oriented to be orthogonal to each other at about 90 degrees.

This connection between the circuit suspension board 1 and the flexible wired circuit board for relay 21 can allow the circuit suspension board 1 and the flexible wired circuit board for relay 21 to be connected to each other while oriented to be orthogonal to each other by simply fitting the bumps 29 of the suspension terminals 26 in the terminal cutouts 10 of the relay terminals 9. It can eliminate the need for taking the process that after the circuit suspension board 1 is bent at the terminal arranging portion 7 at right angle by the machining process, so that the relay terminals 9 are oriented at right angle to be orthogonal to the surface of the supporting board 2, the suspension terminals 26 of the flexible wired circuit board for relay 21 are connected to the orthogonally-oriented relay terminals 9 from the lateral side. Hence, an improved working efficiency in the connection between the circuit suspension board 1 and the flexible wired circuit board for relay 21 in the state of orienting to be orthogonal to each other can be provided for the simple structure.

Figure 9:
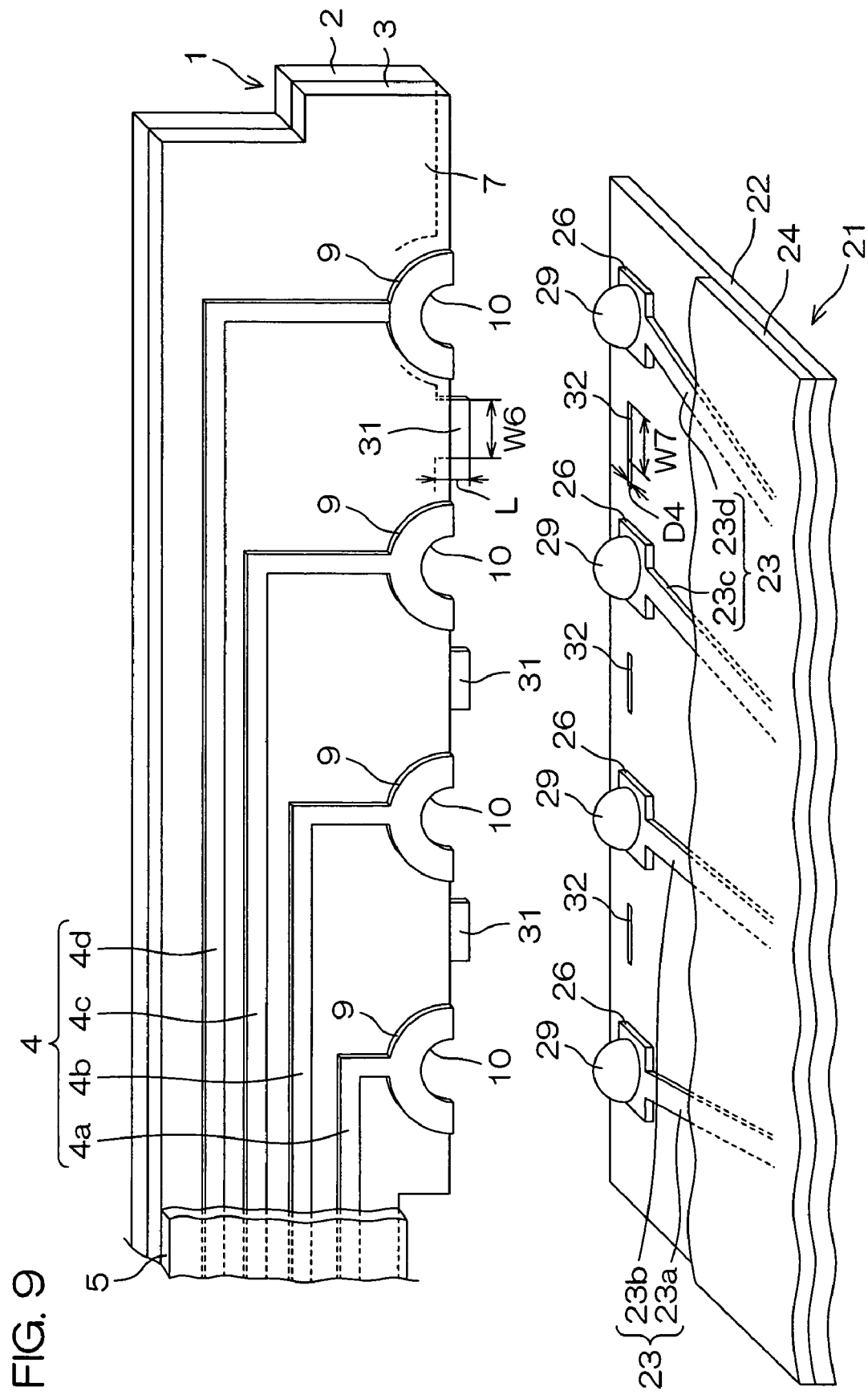
FIG. 9 is a perspective view for illustrating a principal part of the connection between the circuit suspension board of another embodiment and the flexible wired circuit board for relay of another embodiment.
Figure 10:
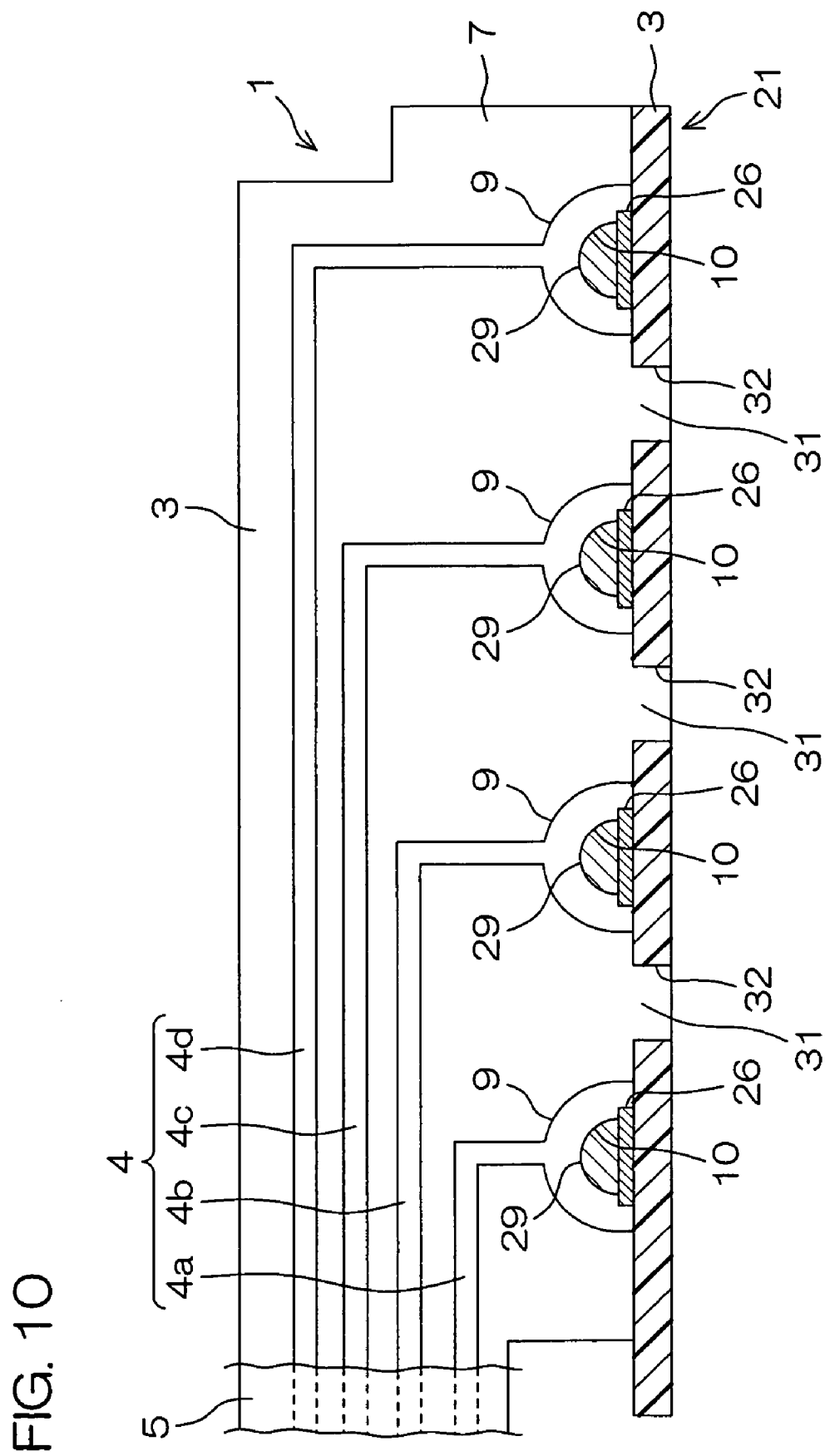
FIG. 10 is a cross-sectional view for illustrating a principal part of the connection between the circuit suspension board of another embodiment and the flexible wired circuit board for relay of another embodiment.

In the connecting structure mentioned above, the circuit suspension board 1 has projections 31 projecting from the edge of the supporting board 2 formed in locations of the supporting board 2 corresponding to between the relay terminals 9 adjoining to each other, while on the other hand, the flexible wired circuit board for relay 21 has positioning holes 32 formed between the suspension terminals 26 adjoining to each other and extending through the insulating base layer 22 in a thickness direction thereof for positioning the circuit suspension board 1, as shown in FIG. 9. This structure can provide the result that the circuit suspension board 1 and the flexible wired circuit board for relay 21 can be precisely positioned relative to each other with respect to the orthogonal direction by simply fitting the projections 31 in the positioning holes 32, as shown in FIG. 10. This can provide improved reliability in connection between the relay terminals 9 and the suspension terminals 26.

The projections 31 are provided to extend continuously from the supporting board 2. These projections 31 are formed at the widthwise edge of the circuit suspension board 1 on the terminal arranging portion 7, to project in a generally rectangular shape from between the relay terminals 9 toward a widthwise outward of the circuit suspension board 1.

The projections 31 can be formed in the process shown in FIG. 4(*e*) at the same time as the process of forming the supporting board cutouts 13 in the supporting board 2 and the process of trimming the circuit suspension board 1.

The projections 31 are formed to have a thickness of e.g. 10-50 μm, a width W6 of e.g. 30-100 μm, and a projecting length L of 10-100 μm.

It is to be noted that the insulating cover layer 3, the conductive pattern 4, and the insulating cover layer 5 may be formed for each projection 31.

The formation of the projections 31 can ensure that the circuit suspension board 1 is precisely placed relative to the flexible wired circuit board for relay 21 with respect to the orthogonal direction by simply positioning the projections 31 with the positioning holes 32.

The positioning holes 32 of a generally rectangular shape are formed between the suspension terminals 26 adjoining to each other, extending through the insulating base layer 22 in the thickness direction thereof.

In the case where the insulating base layer 22 is formed in a predetermined pattern, the positioning holes 32 can be formed at the same time as the formation of the pattern. In the case where the insulating base layer 22 is prepared in the form of a film, the positioning holes 32 can be formed by the boring process, such as laser beam machining and punching.

The positioning holes 32 are formed to have a width W7 of e.g. 30-100 μm, and a depth D4 of e.g. 20-100 μm. When the width W7 is in excess of 100 μm, the interval between the adjacent lines of wire 23 is increased, so that it may become difficult to form a fine pattern.

The formation of the positioning holes 32 can ensure that the flexible wired circuit board for relay 21 is precisely placed relative to the circuit suspension board 1 by simply positioning the projections 31 with the positioning holes 32.

EXAMPLE

While in the following, the present invention will be described in further detail with reference to Examples, the present invention is not limited thereto.

Example 1

Production of Circuit Suspension Board

A supporting board of stainless foil having thickness of 25 μm was prepared (Cf. FIG. 4(*a*)) and, then, an insulating base layer of polyimide resin having thickness of 10 μm was formed on the supporting board to have a predetermined pattern (Cf FIG. 4(*b*)).

The insulating base layer was formed by the process that after a varnish of photosensitive polyamic acid resin was coated over the entire surface of the supporting board, the varnish is exposed to light through a photo mask and then developed, to form the coating in the form of a predetermined pattern including an area where the conductive pattern was formed. Then, after dried, the varnish was cured by heating. The insulating base layer was formed in the manner mentioned above.

Then, a conductive pattern comprising a plurality of lines of wire, magnetic head terminals, and relay terminals, all of which were integrally formed, was formed by the additive process (Cf. FIG. 4(*c*)).

In the additive process, a thin metal film was formed on the entire surface of the insulating base layer, first, and, then, a plating resist having thickness of 20 μm of a reverse pattern to the conductive pattern was formed on the thin metal film. Thereafter, the conductive pattern of copper having thickness of 10 μm was formed by the electrolytic copper plating. Thereafter, the plating resist was removed by solution of sodium hydroxide and further the thin metal film exposed from the conductive pattern was removed by wet etching.

In the formation of the conductive pattern, terminal cutouts having an opening width of 450 μm and a cutout depth of 450 μm was formed in the relay terminals.

Thereafter, an insulating cover layer of polyimide resin having a thickness of 4 μm was formed on the insulating base layer to cover the conductive pattern (Cf. FIG. 4(d)).

The insulating cover layer was formed by the process that after a varnish of photosensitive polyamic acid resin was coated over the entire surface of the insulating base layer, to cover the conductive pattern, the varnish is exposed to light through the photo mask and then developed, to form the coating in a predetermined pattern, such that the lines of wire were covered but their portions corresponding to the magnetic head terminals and the relay terminals at opposite ends of the lines of wire were uncovered. Then, after dried, the coating was cured by heating. As a result, the insulating cover layer of the predetermined pattern where the lines of wire were covered but the magnetic head terminals and the relay terminals were uncovered or exposed was formed.

Then, after supporting board cutouts having an opening width of 550 μm and a cutout depth of 550 μm were formed in the supporting board by chemical etching using ferric chloride solution (Cf FIG. 4(e)), insulating base layer cutouts having an opening width of 350 μm and a cutout depth of 350 μm were formed in the insulating base layer by chemical etching using alkaline solution (Cf FIG. 4(f)).

Thereafter, a nickel plating layer having thickness of 3 μm and a gold plating layer having thickness of 1 μm were sequentially formed on the magnetic head terminals and the relay terminals by electroless plating. The circuit suspension board was obtained in the manner mentioned above.

Example 2

Production of Flexible Wired Circuit Board for Relay

An insulating base layer of a polyimide resin film having thickness of 12.5 μm was prepared (Cf. FIG. 6(a)), first. Then, after epoxy resin adhesive was coated over the entire surface of the insulating base layer to form an adhesive layer having thickness of 15 μm, a rolled copper foil having thickness of 18 μm was adhesively bonded to the insulating base layer via the adhesive layer.

Then, an etching resist having thickness of 10 μm was formed on a surface of the copper foil, to be in the form of a pattern corresponding to the conductive pattern. Thereafter, after the copper foil exposed from the etching resist was etched using ferric chloride solution, the etching resist was removed by stripping. As a result, a conductive pattern comprising lines of wire, suspension terminals, external terminals, and preamplifier IC terminals, all of which were integrally formed, were formed on the insulating base layer (Cf FIG. 6(b)).

Then, an insulating cover layer was formed on the insulating base layer, to cover the conductive pattern (Cf FIG. 6(c)).

The insulating cover layer was formed in the following manner. Epoxy resin adhesive was previously coated over a polyimide resin film having thickness of 12.5 μm and having openings formed at locations corresponding to the suspension terminals, the external terminals, and the preamplifier IC terminals, to form an adhesive layer having thickness of 15 μm. Thereafter, the insulating cover layer was formed in the form of a predetermined pattern on the insulating base layer, such that the lines of wire were covered and the suspension terminals, the external terminals, and the preamplifier IC terminals were exposed through the adhesive layer.

Then, generally hemispherical-shaped bumps of 600 μm φ in size of the bottom and 300 μm in height were formed on the suspension terminals and the external terminals by using solder cream (Cf FIG. 6(d)). Thereafter, an aluminum stiffener sheet having thickness of 300 μm was adhesively bonded to the back side of the insulating base layer through the adhesive layer having thickness of 25 μm, to stiffen portions of the insulating base layer corresponding to the suspension terminals, the external terminals, and the preamplifier IC terminals. The flexible wired circuit board for relay was obtained in the manner mentioned above.

Example 3

Connecting Structure

The relay terminals of the circuit suspension board of Example 1 and the suspension terminals of the flexible wired circuit board for relay of Example 2 were located to confront each other by orienting the circuit suspension board and the flexible wired circuit board for relay to be orthogonal to each other. Then, the bumps of the suspension terminals were received in the terminal cutouts in the relay terminals in a widthwise inward direction of the circuit suspension board, whereby the bumps of the suspension terminals were fitted in the terminal cutouts in the relay terminals. As a result of this, the relay terminals and the suspension terminals were electrically connected to each other.

Example 4

Production of Circuit Suspension Board

Except that when the supporting board cutouts were formed in the supporting board, the supporting board was chemically etched so that it could have projections, formed at locations corresponding to between the relay terminals adjoining to each other, to project from edges thereof toward widthwise outward of the circuit suspension board, the same processes as those of Example 1 were taken to obtain the circuit suspension board. The projections were formed to have a width of 80 μm and a projecting length of 50 μm.

Example 5

Production of Flexible Wired Circuit Board for Relay

Except that after the stiffener sheet was adhesively bonded to the insulating base layer, positioning holes were formed at locations corresponding to between the suspension terminals adjoining to each other, to extend through the insulating base layer in the thickness direction by a YAG laser processing, the same processes as those of Example 2 were taken to obtain the circuit suspension board.

The positioning holes were formed to have a width of 80 μm and a depth of 40 μm.

Example 6

Connecting Structure

The relay terminals of the circuit suspension board of Example 4 and the suspension terminals of the flexible wired circuit board for relay of Example 5 were located to confront each other, with the circuit suspension board and the flexible wired circuit board for relay oriented to be orthogonal to each other and, then, the projections were inserted in the positioning holes. In addition to this, the bumps of the suspension terminals were received in the terminal cutouts in the relay terminals toward a widthwise inward of the circuit suspension board, whereby the bumps of the suspension terminals were fitted in the terminal cutouts in the relay terminals. As a result of this, the relay terminals and the suspension terminals were electrically connected to each other.

While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:

1. A connecting structure of a wired circuit board comprising:
   a first wired circuit board comprising:
      a first insulating base layer;
      a first conductive pattern formed on the first insulating base layer;
      a metallic supporting layer formed on the first insulating base layer on a side opposite the first conductive pattern; and
      first terminals formed along an edge of the first wired circuit board, the first terminals comprising:
         terminal cutouts that are formed by cutting out an edge portion of the first conductive pattern along a direction that is orthogonal to a thickness direction of the first conductive pattern,
         insulating base layer cutouts that are formed by cutting out areas that correspond to cutout areas defined by the terminal cutouts,
         metallic supporting layer cutouts formed by cutting out areas that correspond to the cutout areas defined by the insulating base layer cutouts,
      wherein a plurality of the first terminals are provided at spaced intervals along the edge of the first wired circuit board, and
      projections are provided that project from an edge of the metallic supporting layer along a direction orthogonal to a thickness direction of the metallic supporting layer, the projections being provided between adjacent first terminals, and
   a second wired circuit board comprising:
      a second insulating base layer;
      a second conductive pattern that is formed on the second insulating base layer; and
      second terminals that are adapted to be connected with the first terminals of the first wired circuit board, the second terminals being provided at spaced intervals on the second insulating base layer, and
      positioning holes that extend through the second insulating base layer in a thickness direction and are formed between adjacent second terminals,
      wherein the positioning holes are adapted to receive the projections from the first wired circuit board to align the second wired circuit board and the first wired circuit board.

2. A first wired circuit board comprising: a support layer; an insulating base layer formed on the support layer; a conductive pattern formed on the insulating base layer, the conductive pattern including conductor lines; and terminals that are formed along an edge of the first wired circuit board and that are electrically coupled to the conductor lines, the terminals comprising: a terminal cutout portion that is defined by a first radius; and an insulating base layer cutout portion that is defined by a second radius, the second radius being larger than the first radius to expose a side surface of the conductive pattern, a support layer cutout portion that is defined by a third radius, the third radius being larger than the second radius to expose a side surface of the insulating base layer, wherein the terminal cutout portion, the insulating base layer cutout portion, and the support layer cutout portion are positioned along a thickness direction of the terminals.

3. The first wired circuit board according to claim 2, wherein the support layer cutout portion is a semicircular arc shape, an oval shape, an ellipse shape, a V-shape or a U-shape.

4. The first wired circuit board according to claim 2, wherein the support layer is metallic.

5. The first wired circuit board according to claim 2, wherein the terminal cutout portion and the insulating base layer cutout portion are concentric.

6. The first wired circuit board according to claim 2, wherein the terminal cutout portion is one of a semicircular arc shape, an oval shape, an ellipse shape, a V-shape or a U-shape.

7. The first wired circuit board according to claim 2, wherein the insulating base layer cutout portion is a semicircular arc shape, an oval shape, an ellipse shape, a V-shape or a U-shape.

8. The first wired circuit board according to claim 5, wherein the insulating base layer cutout portion and the support base layer cutout portion are concentric.

* * * * *